United States Patent
Dong et al.

(10) Patent No.: US 7,297,597 B2
(45) Date of Patent: Nov. 20, 2007

(54) METHOD FOR SIMULTANEOUSLY FABRICATING ONO-TYPE MEMORY CELL, AND GATE DIELECTRICS FOR ASSOCIATED HIGH VOLTAGE WRITE TRANSISTORS AND GATE DIELECTRICS FOR LOW VOLTAGE LOGIC TRANSISTORS BY USING ISSG

(75) Inventors: Zhong Dong, San Jose, CA (US); Chuck Jang, Fremont, CA (US); Ching-Hwa Chen, Milpitas, CA (US); Chia-Shun Hsiao, Cupertino, CA (US)

(73) Assignee: Promos Technologies, Inc., Hsinhu (TW)

( * ) Notice: Subject to any disclaimer, the term of this patent is extended or adjusted under 35 U.S.C. 154(b) by 367 days.

(21) Appl. No.: 10/898,273

(22) Filed: Jul. 23, 2004

(65) Prior Publication Data

US 2006/0017092 A1    Jan. 26, 2006

(51) Int. Cl.
*H01L 21/336* (2006.01)
(52) U.S. Cl. ............................. 438/261; 257/E21.625
(58) Field of Classification Search ............... 438/216, 438/260, 261; 257/E21.625
See application file for complete search history.

(56) References Cited

U.S. PATENT DOCUMENTS 6,358,867 B1 * 3/2002 Tews et al. ................. 438/771

2005/0110102 A1 * 5/2005 Wang et al. ................. 257/411

OTHER PUBLICATIONS

Trowbridge, "Enhanced Oxidation of Silicon Nitride using In Situ Steam Generation", 199th ECS Conference, 2001, No. 269. 2001.*

* cited by examiner

*Primary Examiner*—Chandra Chaudhari
(74) *Attorney, Agent, or Firm*—MacPherson Kwok Chen & Heid LLP (57) ABSTRACT

Conventional fabrication of top oxide in an ONO-type memory cell stack usually produces Bird's Beak. Certain materials in the stack such as silicon nitrides are relatively difficult to oxidize. As a result oxidation does not proceed uniformly along the multi-layered height of the ONO-type stack. The present disclosure shows how radical-based fabrication of top-oxide of an ONO stack (i.e. by ISSG method) can help to reduce formation of Bird's Beak. More specifically, it is indicated that short-lived oxidizing agents (e.g., atomic oxygen) are able to better oxidize difficult to oxidize materials such as silicon nitride and the it is indicated that the short-lived oxidizing agents alternatively or additionally do not diffuse deeply through already oxidized layers of the ONO stack such as the lower silicon oxide layer. As a result, a more uniform top oxide dielectric can be fabricated with more uniform breakdown voltages along its height. Additionally, adjacent low and high voltage transistors may benefit from simultaneous formation of their gate dielectrics with use of the radical-based oxidizing method.

19 Claims, 10 Drawing Sheets

METHOD FOR SIMULTANEOUSLY FABRICATING ONO-TYPE MEMORY CELL, AND GATE DIELECTRICS FOR ASSOCIATED HIGH VOLTAGE WRITE TRANSISTORS AND GATE DIELECTRICS FOR LOW VOLTAGE LOGIC TRANSISTORS BY USING ISSG

1. FIELD OF DISCLOSURE

The present invention relates generally to fabrication of monolithically integrated semiconductor devices.

The invention relates more specifically to the formation in a monolithic device of gate insulation for a charge-retaining structure used in non-volatile reprogrammable memory such as the type generically known as an ONO stack and to the simultaneous formation of gate dielectric for associated high voltage transistors and to the simultaneous formation of gate dielectric for low voltage transistors.

2a. CROSS REFERENCE TO CO-OWNED APPLICATIONS

The following copending U.S. patent applications are owned by the owner of the present application, and their disclosures are incorporated herein by reference:

(A) Ser. No. 10/442,759 filed May 20, 2003 by Zhong Dong et al. and which is originally entitled, Methods for Improving Quality of High Temperature Oxide (HTO) Formed from Halogen-Containing Precursor and Products Thereof and Apparatus Therefor; and (B) Ser. No. 10/821,100 filed Apr. 7, 2004 by Zhong Dong et al. and which is originally entitled, Method of Forming ONO-Type Sidewall with Reduced Bird's Beak.

3. DESCRIPTION OF RELATED ART

So-called, FLASH memory devices and alike forms of electrically re-programmable and nonvolatile memory devices have become commercially popular due, in part, to their ability to store data in a small and dense form factors, their ability to be repeatedly and quickly re-programmed, and their ability to retain programmed data in a nonvolatile fashion so that even when power is lost, the stored data is preserved.

One relatively simple format of such electrically re-programmable nonvolatile memories is known as the vertically-stacked gate configuration. In this configuration, a so-called "floating gate" (FG) electrode is insulatively sandwiched between an underlying, tunnel insulator layer and an overlying, inter-gates insulator (IGI) layer. A so-called "control gate" (CG) electrode is stacked atop the inter-gates insulator (IGI) layer. In some embodiments (NAND Flash) there is also a select gate (SG) for enabling a group of cells. Under the tunnel insulator layer (beneath the FG) there is typically provided a semiconductive channel region with opposed source (S) and drain (D) regions for defining a multi-gate transistor.

Because of the way the layers stack in the stacked gates memory cell, the IGI layer (inter-gates insulator layer) is sandwiched at least between the floating gate electrode (FG) and the control gate electrode (CG). The inter-gates insulator (IGI) layer typically contains a series of different dielectric materials. The classical combination is that of silicon Oxide, silicon Nitride and again silicon Oxide in the recited order, hence the name, ONO. Such sandwiching of different kinds of dielectric material layers between the gate electrodes, as well as the use of conductive materials to form the gate electrodes can create problems as will be further explained shortly. In passing, it is to be observed that other types of more complicated configurations of gate electrodes are possible beyond the simple stacking of a CG electrode above an FG electrode. These other configurations may include various staggered gate configurations. The example of the simpler, stacked gate configuration will be sufficient for describing the improvement disclosed herein.

The insulatively-isolated floating gate (FG) of a stacked gates cell is intended to store a relatively precise amount of charge and to retain that stored amount of charge even when external power is turned off. The amount of charge stored by the FG can be used to define the data state of the memory cell. The state of the memory cell can be altered by moving additional charge into the FG for representing a first data state and by removing charge from the FG for representing another data state. Different mechanisms may be used for injecting charge into or removing charge from the FG, including hot carrier injection and/or Fowler-Nordheim tunneling.

The charged or uncharged state of the floating gate (FG) can be sensed by applying a cell-read voltage $V_{GS\text{-}read}$ to the control gate (CG), where the cell-read voltage $V_{GS\text{-}read}$ is selected to cause a first magnitude of current conduction between the drain (D) and source (S) regions of the cell when the floating gate (FG) is in a first programmed state and to cause no or a different magnitude of IDS to flow when the floating gate (FG) is in another programmed state. (Some devices store multiple data bits per cell, where each of different amounts of charge trapped within the FG represents a different multi-bit pattern.) During data write and/or erase operations, it is common to apply relatively large voltages ($V_{GS\text{-}write}$ or $V_{GS\text{-}erase}$) to the control gate (CG) so as to induce Fowler-Nordheim tunneling and/or other charge transport mechanisms between the floating gate (FG) and one or more other electrode regions within the memory cell (including source and/or drain regions).

It is important, for purposes of carrying out the various read and write/erase operations of floating gate type memory cells (e.g., stacked gate cells), to establish an appropriate pattern of electric field intensities through the insulators, especially the ones that surround the charge-storing, floating gate (FG). These electric fields (E-fields) may be established by generating correspondingly appropriate voltages between the control gate (CG), the drain (D), the source (S) and/or substrate (U) regions of the memory cell. Those skilled in the art will appreciate that electric field intensity in dielectric insulators is usually a function of voltage difference (V) divided by dielectric thickness (d) and multiplied by dielectric constant (E=kV/d). Capacitive coupling is a function of plate area divided by dielectric thickness (C=f(kA/d)). In order to get consistent results from one mass produced device to the next, it is important to maintain precise control, during mass production, over the per-cell plate-area (A), the dielectric thickness (d) and the dielectric constant (k) of the various insulators which surround the FG of each cell so that same results will occur in one device and the next for a given control gate voltage ($V_{CG}$). Stated otherwise, consistently same capacitive coupling should occur, without excessive leakage, from one mass produced device to the next as measured between the CG, the FG, the source (S), the drain (D) and the substrate (U).

Persons skilled in the art will appreciate that most insulators are not perfect. A small amount of leakage current can flow through them. They can undergo high voltage breakdown. Contaminating chemicals can pass through pinhole or other defects in the insulators. Much progress has been made in the formation of the so-called, thermal gate oxide insulator that normally lies between the substrate and the floating gate (FG). However, the inter-gates insulator layer (IGI) that is typically sandwiched between the FG and the CG still poses numerous problems.

The inter-gates insulator layer (IGI) is particularly prone to problems with excessive leakage current, premature voltage breakdown, and inconsistent mass production results. Practitioners in the art have developed a so-called ONO solution. According to basic ONO practice, after the material for the floating gate (FG) is deposited (typically it is doped polysilicon), three insulative layers are vapor deposited in sequence. The three insulative layers are respectively composed of silicon-Oxide, silicon-Nitride and silicon-Oxide; hence the ONO acronym. The material for the control gate (CG) is then deposited (typically it is doped polysilicon) on top of the ONO structure. The ONO structure is advantageous because the silicon-nitride ($Si_3N_4$) in the middle generally has a greater dielectric constant (k) than does the silicon dioxide ($SiO_2$) at the top and bottom. The higher dielectric constant of the silicon-Nitride layer in the ONO stack allows cell designers to use lower gate voltages than would otherwise be possible for an equal thickness of insulator material made of only silicon-oxide. It is desirable to keep gate voltages relatively small. The ONO approach allows this to happen.

Despite improvements in fabrication techniques, the ONO approach still suffers from various problems including the formation of Bird's Beak between the different material layers of the ONO stack. It is believed that the oxidation-resistant properties of the middle silicon-nitride layer make it difficult to consistently form insulation of both good quality and consistent dimensions during mass production. Silicon nitride resists conventional oxidation more so than does silicon oxide. As a result, when the top oxide of the ONO sequence is being formed after the middle nitride of the ONO stack has already been deposited, part of the oxidation reaction proceeds non-uniformly by diffusing through oxide-containing sidewall areas of the ONO stack and by non-uniformly increasing oxide thickness at the peripheral sides of the floating gate electrode (FG) while leaving the sides and top of the silicon nitride layer relatively un-oxidized. This differential behavior often results in the formation of a Bird's Beak geometry. (A deformity that is V-shaped, with the V rotated about 90 degrees.) As a result, dielectric thickness is no longer uniform across device layers. This in turn makes it more difficult to guarantee consistent device performance for mass-produced memory cells. Often the sidewall portions of the ONO stack are seen to have slightly greater height dimensions than the middle of the ONO stack due to Bird's Beak development. Why this is so will be explained in more detail below. The present disclosure shows how such undesirable Bird's Beak formation may be reduced.

At the same time that the dielectric insulator portions (the ONO sequence) of the ONO stack are being formed, it is sometimes desirable to simultaneously form gate dielectric layers for adjacent, high voltage and/or low voltage transistors so that manufacturing costs can be reduced. The present disclosure shows how such simultaneous formation of gate dielectric layers for adjacent transistors may be carried out while Bird's Beak formation is reduced in the ONO stack.

SUMMARY

Structures and methods may be provided in accordance with the present disclosure of invention for improving over the above-described problems.

More specifically, in accordance with one set of aspects of the present disclosure, a high-kinetics, dry oxidation process (ISSG) is used to at least, initiate formation of additional oxide on the top of the nitride layer of the ONO stack, where the process for at least initiating formation of additional oxide includes the generation of atomic oxygen radicals or other such short-lived oxidizing agents for more uniformly producing oxides along exposed nitride-containing regions as well as along exposed silicon-containing regions.

A method in accordance with the present disclosure for forming an ONO-type stack comprises: (a) defining a bottom oxide layer of the ONO-type stack above a substrate, a tunnel oxide and a floating gate layer; (b) defining a middle nitride layer of the ONO-type stack on top of the bottom oxide layer; (c) thermally growing high voltage gate oxide on the substrate; and (d) after the high voltage gate oxide has been grown, generating a sufficient amount of atomic oxygen near said middle nitride layer of the ONO-type stack so as to at least initiate formation of additional oxide on the top of the nitride layer of the ONO type stack. In one set of embodiments, the atomic oxygen generating step is part of a dry ISSG process that includes: (a.1) flowing molecular oxygen ($O_2$) towards the stack; and (a.2) flowing molecular hydrogen (H2) towards the stack, where the volumetric flow ratio of the $H_2$ to the $O_2$ is less than about 0.2.

Other aspects of the disclosure will become apparent from the below detailed description.

BRIEF DESCRIPTION OF THE DRAWINGS

The below detailed description section makes reference to the accompanying drawings, in which.

DETAILED DESCRIPTION

Figure 1:
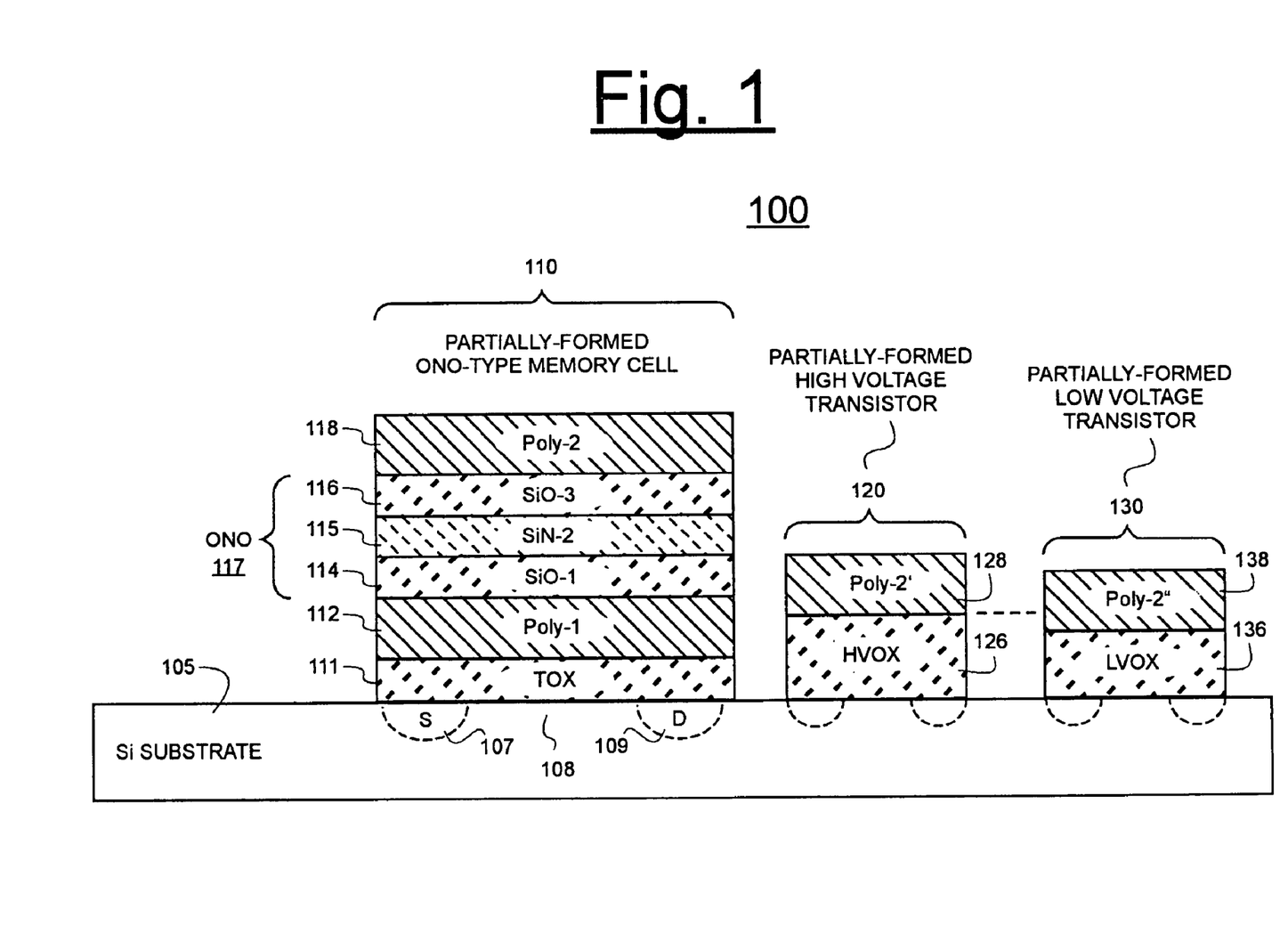
FIG. 1 is a schematic, side cross sectional diagram showing the structure of an ONO-type memory stack (partially formed) and adjacent high voltage and low voltage transistors (partially formed)

FIG. 1 is a schematic, side cross sectional diagram showing a partially-completed ONO memory cell stack 110 that has been formed on a monolithic semiconductor substrate 105 and has been positioned adjacent to a partially-completed, high voltage transistor 120 and also adjacent to a partially-completed, low voltage transistor 130. Fabrication of the memory cell and the adjacent low and high voltage transistors is still in progress at this point. More work will be done to finish the integrated circuit. For example, the source and drain regions, 107 and 108, which are not yet present and are thus shown in phantom, will be implanted at a later time and self-aligned to sidewalls other than the ones shown in FIG. 1. Distances and other dimensional aspects shown in the diagram are not to scale. The schematic of FIG. 1 may apply to embodiments of the present invention and also embodiments outside the scope of invention, depending on what process are used to arrive at the schematically illustrated structure 100.

The illustrated high voltage transistor 120 (partially formed) may be used to selectively apply high voltage erase and/or high voltage write signals to a control gate (CG, defined by Poly-2 layer 118) of the ONO-type stack 110. The low voltage transistor 130 may be used to selectively apply a lower voltage, read signal to the control gate (118). Low and high voltages are relative terms here, these being dependent on the specific channel lengths and gate dielectric thicknesses used in the structure 100. The high voltage is of course, greater than the low voltage. Dielectrics that are to insulate against the high voltage will generally need to have greater thickness and/or to have better insulating characteristics than dielectrics which are to insulate against the low voltage if leakage currents are to be kept relatively small. Formation of the N and P type source/drain regions like 107 and 109 will happen later in the fabrication process, after the illustrated stacked structures 110, 120, 130 have had their lateral dimensions reduced (e.g., by sidewall etch) so as to provide for shorter channel lengths (e.g., 108).

When the transistor-completing fabrication steps are later completed, and the overall, monolithic integrated circuit (IC) 100 becomes an operable whole (e.g., after it is made to include metal interconnect layers and means for coupling to external systems) and after the completed IC is inserted into a larger circuit, various voltages of different magnitudes will develop at corresponding terminal points of the memory cells (only one shown at 110), and at terminal points of the high voltage transistors (only one shown at 120) and at terminal points of the low voltage transistors (only one shown at 130). In anticipation of these low and high voltages, the gate dielectric layer (HVOX) 126 for the high voltage transistors 120 is made relatively thick while the gate dielectric layer (LVOX) 136 for the low voltage transistors 130 is made comparatively thinner. It is often desirable, for purpose of reducing the number of process steps and thus saving cost and manufacturing time, to form the respective gate electrodes 128 and 138 of the low and high voltage transistors, 120 and 130, at the same time that the so-called Poly-2 layer (second polysilicon layer) is deposited to define the control gate (CG) 118 of the ONO-type stack 110.

At the fabrication phase shown in FIG. 1, a monocrystalline silicon substrate 105 has been provided, a tunnel oxide layer (TOX) 111 has been formed on the substrate by thermal growth or otherwise, then a first polysilicon layer (Poly-1) 112 has been deposited for later defining the floating gate (FG) of the corresponding memory cell stack 110. On top of the Poly-1 layer 112, a first silicon oxide layer (SiO-1) 114 has been formed to begin definition of the so-called, ONO stack 117. This has been followed by deposition of a silicon nitride layer (SiN-2) 115 and subsequent formation of a second silicon oxide layer (SiO-3) 116. Although the construction of the device 100 of FIG. 1 is couched here in past tense, use of the past tense for FIG. 1 does not indicate that any specific working example has been fabricated per the description of FIG. 1. The triad of layers defined by the SiO-1 layer 114, the SiN-2 layer 115 and the SiO-3 layer 116 will form the ONO insulation stack 117. (Although a conventional, oxide-nitride-oxide combination is described for purpose of this example, it is within the contemplation of the invention to provide other dielectric materials in place of those shown in the fundamental ONO stack 117. For example, a NONO stack may include oxynitride layers within it. The gate electrodes may be made of conductive materials other than doped polysilicon.)

After the SiO-3 layer 116 was defined in FIG. 1, but before the illustrated tower structure 110 was shaped by way of lithographic patterning to look like a tower, a second polysilicon layer (Poly-2) 118 was deposited for later defining the so-called, control gate (CG) of the corresponding memory cell. On top of the Poly-2 layer 118, a sacrificial passivating layer of silicon nitride (SiN-Pad, not shown) was formed. Then photolithography and/or other patterning steps were used to define an etch mask (not shown). An etchback was performed down to the top surface of the semiconductor substrate 105 so as to thereby leave behind the tower-like shape of the illustrated ONO memory cell stack 110 protruding from the substrate 105 as shown in FIG. 1. Those skilled in the art will appreciate that many copies of the illustrated one ONO memory cell stack 110 will be protruding from the substrate and that the copies will be in spaced apart relation to one another after the etchback process is performed. For sake of simplicity, only one ONO tower is shown. Those skilled in the art will also appreciate that the etchback through the different material layers of the ONO tower—that is, through the nitrides, oxides and polysilicon layers of the example—will typically entail different etch chemistries, each tailored to selectively remove the targeted material. Such details are not relevant to the present disclosure. What is relevant is that the memory cell tower is produced with different materials that can behave differently when exposed to an oxidizing environment. This can lead to formation of Bird's Beak as will be shortly seen.

Figure 2A:
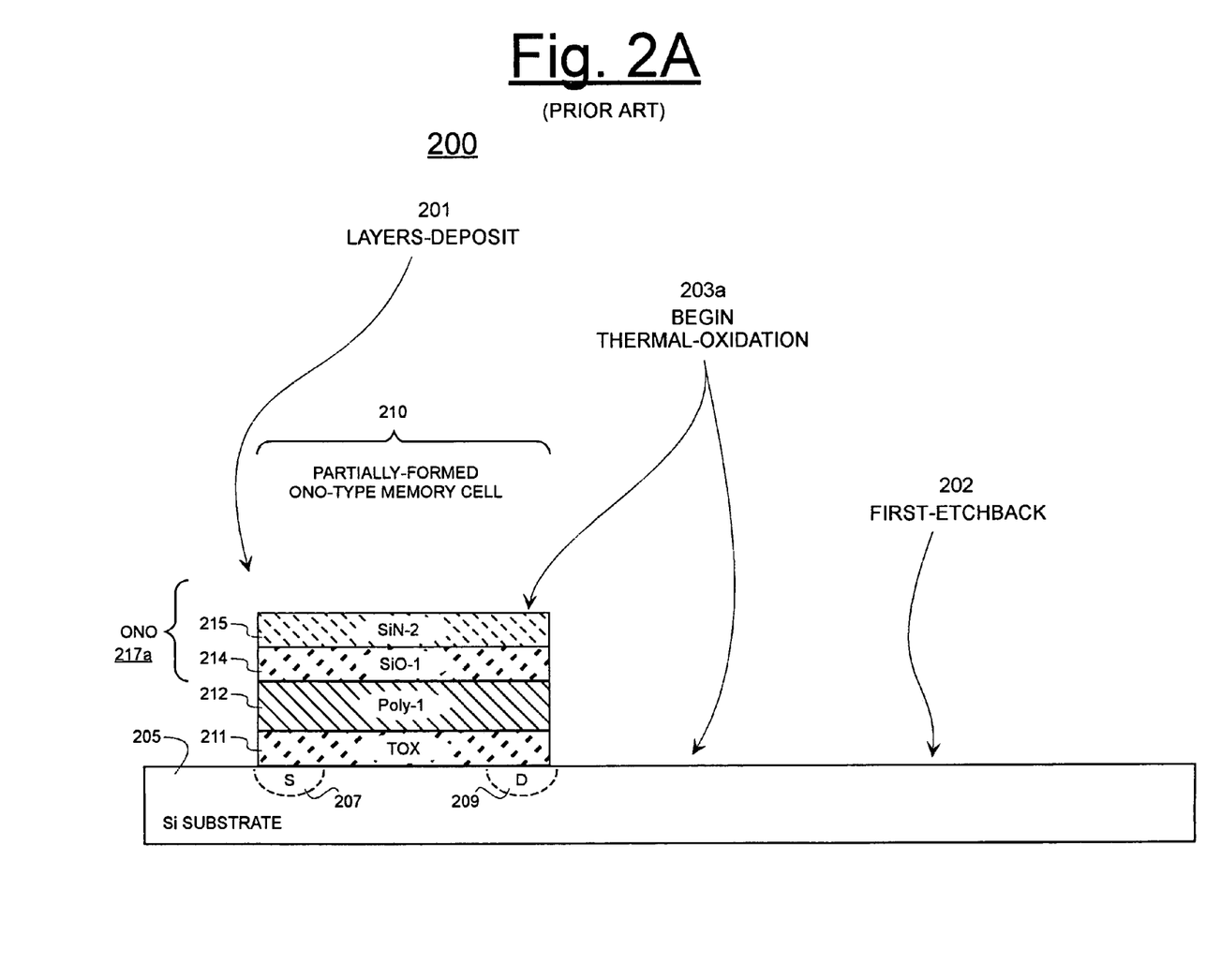
FIG. 2A is a schematic, side cross sectional diagram showing the start of a conventional process in which a high voltage gate dielectric is about to be thermally grown prior to formation of top-oxide material on the topside of a middle nitride layer of a pre-formed and patterned partial-ONO memory cell stack.

FIG. 2A is a schematic, side cross sectional diagram showing an intermediate stage 200 of a conventional process for forming an ONO memory stack 210 as well as adjacent low and high voltage transistors (not yet shown). Where practical, like reference numbers in the "200" century series are used for elements of FIG. 2A which correspond to but are not necessarily the same as the elements represented by similar symbols and reference numbers of the "100" century series in FIG. 1. In FIG. 2A, layers 211, 212, 214 and 215 have been formed by a suitable set 210 of layer deposition or growth steps. Then a first, masked etchback 202 was performed to leave behind the partial tower structure shown at 210. Next thermal oxidation 203a is commenced for oxidizing the exposed surfaces of the substrate 205 and the SiN-2 layer 215. The in-process ONO stack 217a now contains SiO layer 214 and SiN layer 215.

Figure 2B:
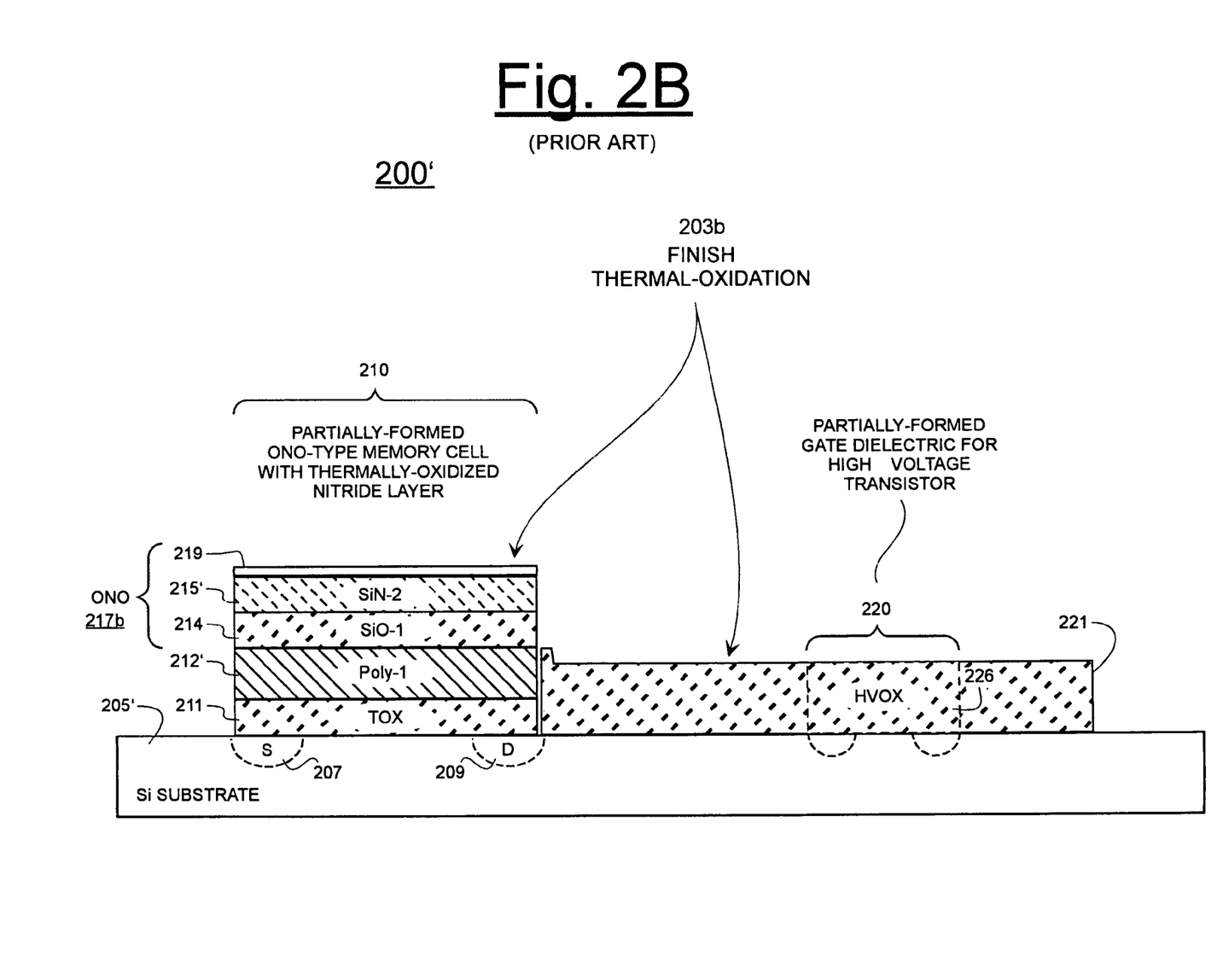
FIG. 2B is a schematic, side cross sectional diagram showing a further step in the conventional process in which the high voltage gate dielectric id being formed.

FIG. 2B is a schematic, side cross sectional diagram showing a subsequent, second intermediate stage 200' of the conventional process. Thermal oxidation step 203b is about to finish. A relatively thick oxide layer 221 has grown from the exposed substrate 205, and as can be seen, the thick oxide layer 221 is to be later used for defining the high voltage gate dielectric region 226 of a planned, high voltage transistor 220. At the same time that thick oxide layer 221 was grown; a relatively thinner, thermal oxide layer 219 also grew on top of SiN layer 215. Silicon atoms for the thinner oxide layer 219 were scavenged out from SiN layer 215'. As a result, the concentration of nitrogen atoms at the top of SiN layer 215' increased. The more nitrogen rich top of SiN layer 215' then functioned as an oxidation stop, blocking further growth of layer 219. The in-process ONO stack 217b now contains SiO layer 214, SiN layer 215' with its nitrogen rich top, and thermal oxide layer 219.

Figure 2C:
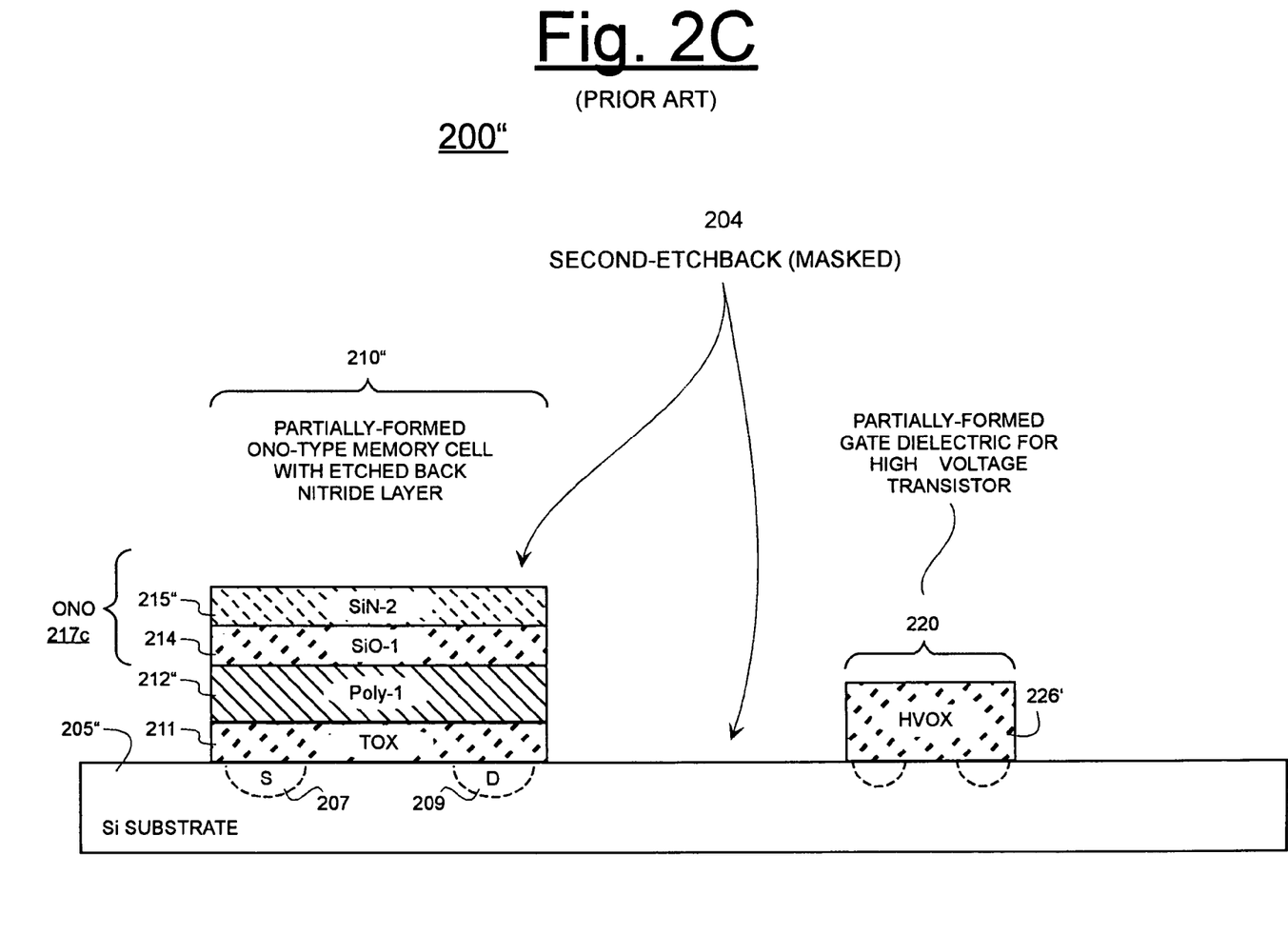
FIG. 2C is a schematic, side cross sectional diagram showing the results of a second etchback step.

FIG. 2C is a schematic, side cross sectional diagram showing a subsequent, third intermediate stage 200" of the conventional process. A second masked etchback 204 was performed to leave behind the partial tower structure shown at 210" as well as the tower structure 220 at which the high voltage transistor will form. The in-process ONO stack 217c now contains SiO layer 214 and SiN layer 215" with its nitrogen rich top, but with its silicon oxide crest (219) removed.

Figure 2D:
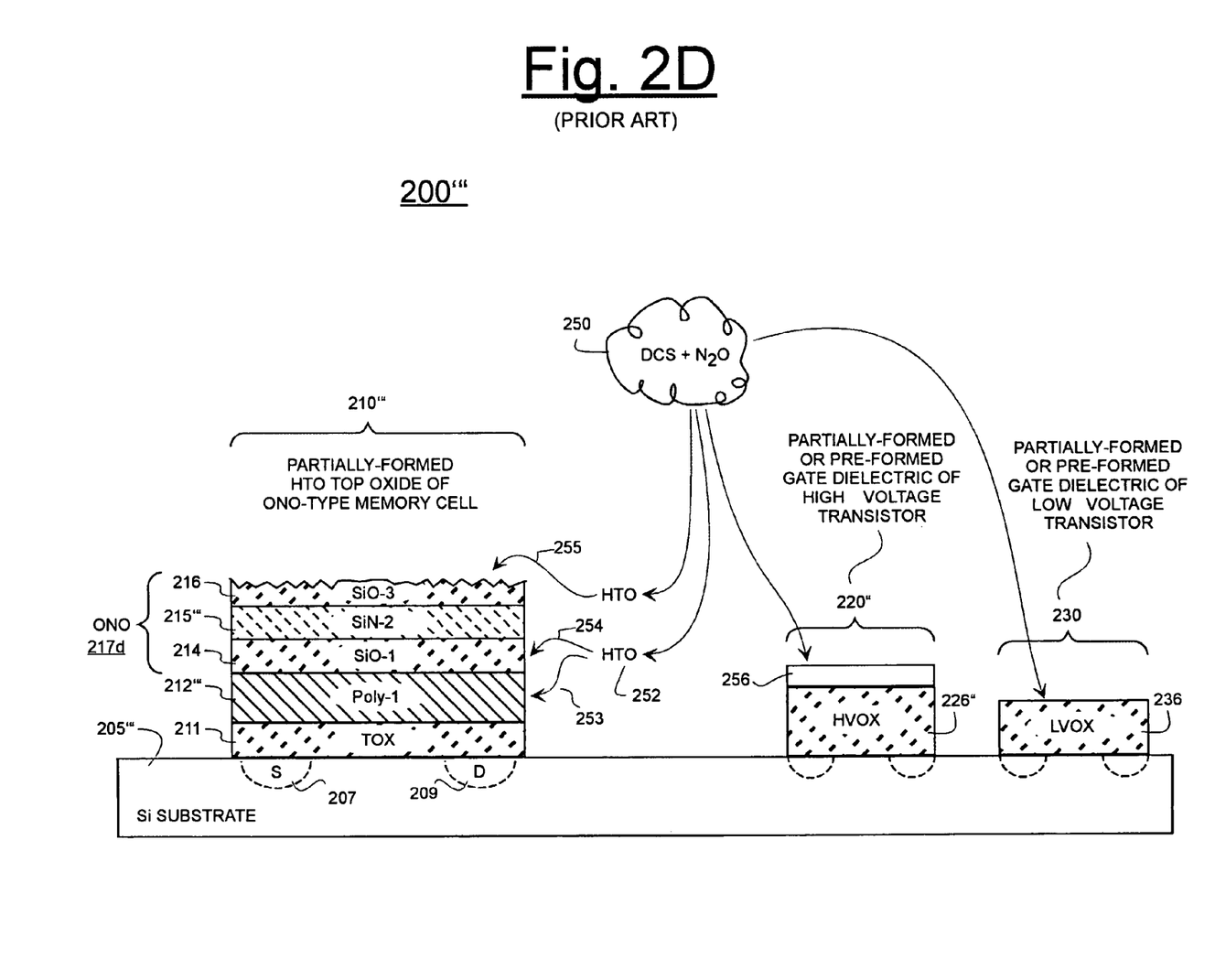
FIG. 2D is a schematic, side cross sectional diagram showing the start of a conventional process (HTO) for forming top-oxide material on the topside of the middle nitride layer of the pre-formed and patterned partial-ONO memory cell stack and also for simultaneously forming oxide material for adjacent high voltage and low voltage gate dielectric areas of a same monolithic substrate.

FIG. 2D is a schematic, side cross sectional diagram showing a subsequent, fourth intermediate stage 200''' of the conventional process. An oxide deposition process 250 has been commenced to begin forming the top-oxide material layer 216 of the ONO stack 217d. High Temperature Oxidation (HTO) is conventionally used as the oxide deposition process 250. One particular HTO process flows DCS (dichlorosilane) and nitrous oxide (N$_2$O) over the exposed ONO memory cell stacks 210''' (only one shown) in order to trigger an exothermic reaction which releases molecular oxidizing agents (e.g., O$_2$) along the exposed tops and sidewalls of the ONO towers 210'''. The DCS plus N$_2$O reaction simultaneously decomposes the DCS to provide silicon atoms for deposition and oxidation about the towers. At the same time, oxide deposition layer 256 forms on HVOX base 226". LVOX deposition layer 236 forms in the vicinity 230 of planned low voltage transistors. Although not shown, masking for the patterned formation of the illustrated silicon oxide depositions 216, 256 and 236 may be provided concurrently or it may be provided afterwards for use in patterned etchback of the deposited oxide.

Of importance, during HTO deposition 250, the oxidizing agents 252 of the HTO deposition process do not interact only with the top of the ONO stack 217d as is indicated by flow path 255. The HTO oxidizing agents 252 also interact with the exposed sidewalls of tower 210''' as is indicated by flow paths 253 and 254. Polysilicon material, such as that present at the sidewalls of layer 212''', tends to oxidize rapidly in the presence of the high temperature, molecular oxygen (O$_2$) released by the HTO process 250. On the other hand, silicon nitride, such as that present at the topside and sidewalls of layer 215''' does not usually oxidize as readily as does the polysilicon. The SiN material layer 215''' also blocks the molecular oxygen (O$_2$) from diffusing through its material. Conversely, the silicon oxide material of layer 214 may permit the molecular oxygen (O$_2$) of flow 254 to diffuse through with relative ease and to attack the upper, oxide-coated surface of polysilicon layer 212'''. Accordingly, oxide is formed at different rates along the sidewalls of the ONO towers 210''' as well as on the top surface 215'''/216 of the ONO towers when the conventional oxidation process (HTO) is used. More specifically, it has been observed that the sidewall encroachment distance by which silicon oxide forms along the nitride sidewall parts (e.g., on the vertical sides of SiN-2 region 215''') tends to be about one tenth (0.1 factor) the encroachment distance by which silicon oxide forms along the polysilicon parts of the sidewalls (e.g., on the vertical sides of Poly-2 region 212'''). As a result, a non-uniform distribution of dielectric material develops.

Figure 2E:
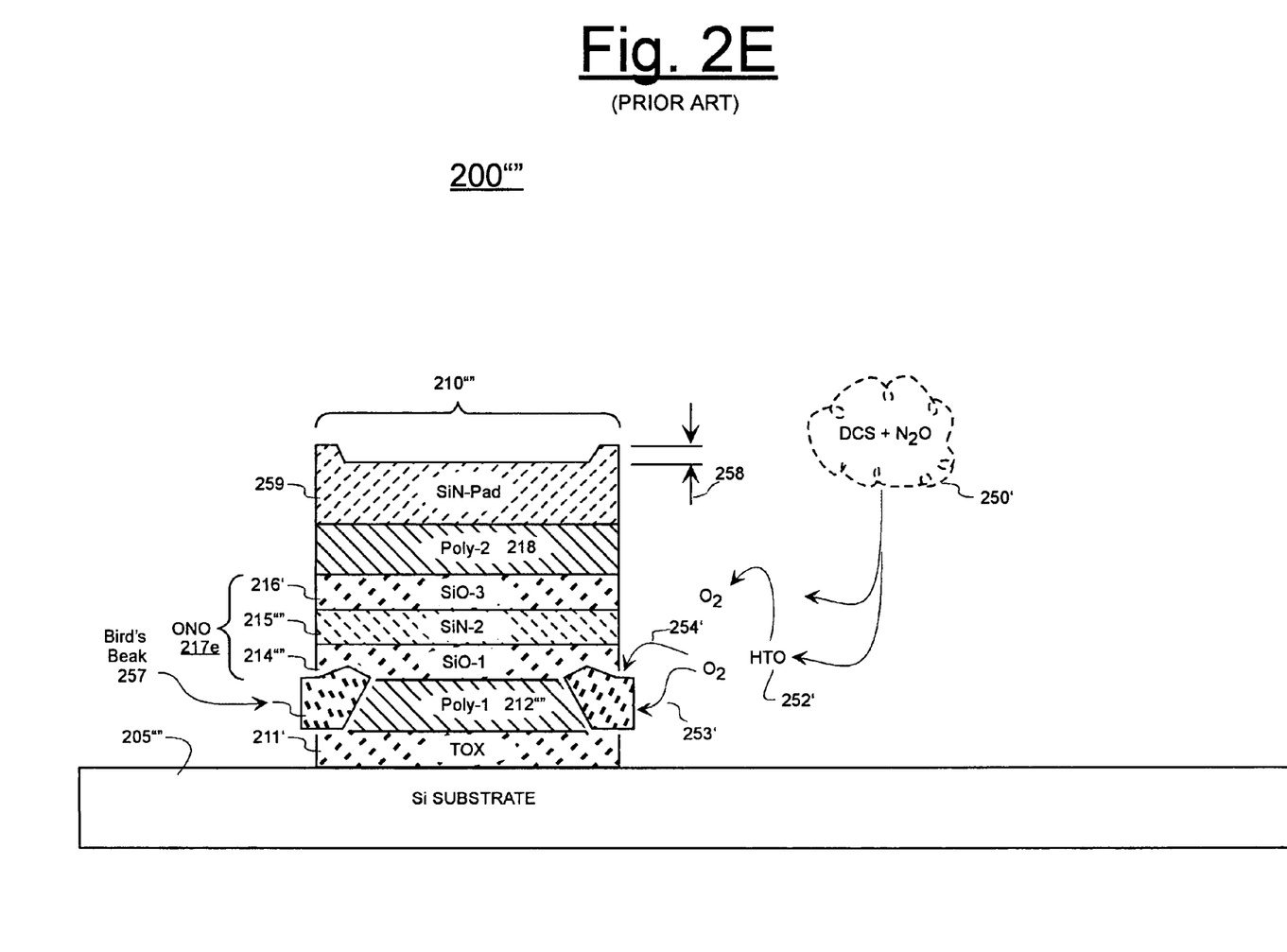
FIG. 2E is a schematic, side cross sectional diagram showing a mechanism in the conventional top-oxide forming process of FIG. 2D (HTO) which is believe to contribute to formation of a Bird's Beak structure.

FIG. 2E is a schematic, side cross sectional diagram showing a subsequent, fifth intermediate stage 200'''' of the conventional process. The oxide deposition process 250 has completed even though it is shown in phantom at 250'. The rapid formation of silicon oxide around layer 212'''' has produced Bird's Beak formation 256 (composed of silicon oxide). A second polysilicon layer 218 was subsequently deposited for defining the control gate (CG). A sacrificial silicon nitride layer 259 was formed on the polysilicon layer 218. For sake of illustrative convenience, tower 210'''' is shown alone without the adjacent low and high voltage transistor towers (220'' and 230 of FIG. 2D). The Bird's Beak formations 256 tend to produce height distortions, as are schematically illustrated at 258. Schematic icon 258 indicates that the heights of the sidewall portions (outer edges) of the memory cell ONO stack 210'''' are noticeably greater than the height of the central portion of the same stack 210''''. The Bird's Beak formation can produce undesirable stresses in the stack 210'''' as well as non uniform electric field distributions, different effective plate areas for the capacitive structures, and premature voltage breakdown. It would therefore be advantageous if practical methods could be found for reducing or eliminating Bird's Beak formation while still being able to form a silicon oxide layer like 216 of FIG. 2D simultaneously with formation of the silicon oxide layers 256 and 236 of the low and high voltage transistors.

Figure 3:
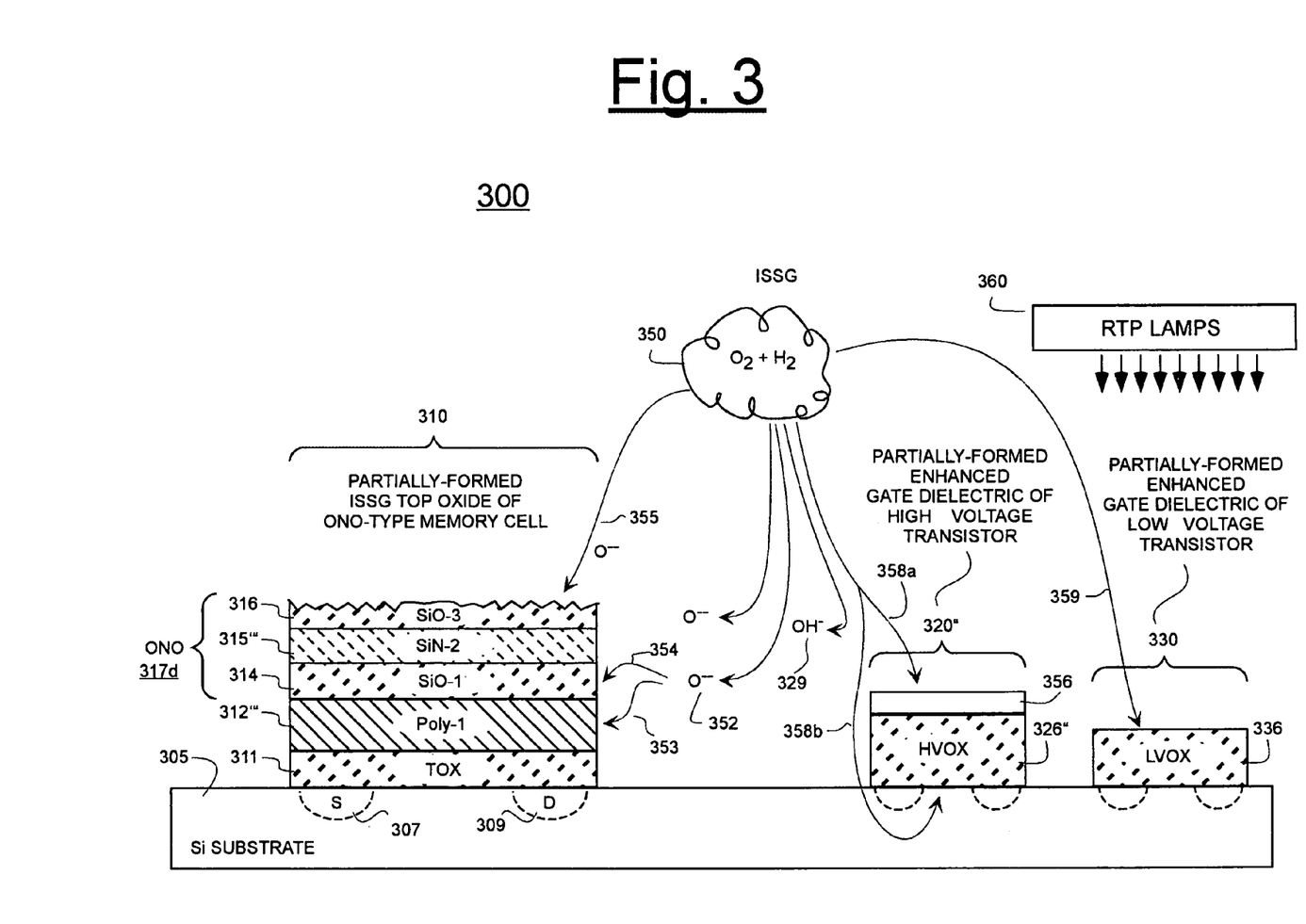
FIG. 3 is a schematic, side cross sectional diagram showing the start of a process (ISSG) in accordance with the disclosure for forming top-oxide material on the topside of the middle nitride layer of the pre-formed and patterned partial-ONO type memory cell stack and also for simultaneously forming oxide material for adjacent high voltage and low voltage gate dielectric areas of a same monolithic substrate.

FIG. 3 is a schematic, side cross sectional diagram showing an alternate fourth intermediate stage 300 that, in accordance with the invention, replaces stage 200''' of FIG. 2D of the conventional process. Where practical, like reference symbols and numbers in the "300" primed series are used for elements of FIG. 3 which correspond to but are not necessarily the same as the elements represented by similar primed symbols and reference numbers of the "200" series in FIG. 2D. As such, a repeated introduction is not necessary. In FIG. 3, instead of relying on HTO, the oxide deposition process 350 uses a high-kinetics, dry oxidation process (dry-ISSG) to at least initially begin oxidizing the top of SiN layer 315''' of the ONO tower 310. "ISSG" is an industry-recognized acronym for In-Situ Steam Generation. However, despite its name, wet steam is not formed in dry-ISSG. Instead, a stream of H$_2$ is typically supplied in the presence of a volumetrically, faster flowing stream of O$_2$ and in the presence of heat (e.g., provided from InfraRed lamps (IR source) 360) to thereby produce free atomic oxygen (e.g., O$^{--}$) and/or other radicals (not molecularly bound) which can combine with the materials in the multi-layered tower 310 to form topside dielectric layer 316 on the nitride-containing layer 315'''. ISSG-initiated oxide forms more uniformly on nitride-containing surfaces (e.g., topside of SiN-2 layer 315''') as well as on oxide-containing surfaces (e.g., topside of HVOX layer 326'') and on silicon-containing surfaces (e.g., topside of substrate 305, in area 330, where LVOX layer 336 starts forming as a result of the ISSG process 350).

Use of the dry-ISSG process has been found to reduce Bird's Beak formation as shall be explained below with reference to FIG. 4A. In one set of embodiments for the ISSG process 350 of FIG. 3, the volumetric flow ratio of $H_2/O_2$ (each in terms of sccm) is less than about 0.2. In a subset of these embodiments, the volumetric flow ratio of $H_2/O_2$ is less than about 0.1. In another subset of these embodiments, the volumetric flow ratio of $H_2/O_2$ is equal to, or less than, about 0.02.

It is believed that ISSG-produced free atomic oxygen (e.g., $O^{--}$ as illustrated at 352) and/or hydroxyl radicals (e.g., OH as illustrated at 329) and/or other radicals tend to form readily adjacent to the topside sites where the silicon oxide dielectric will initially and desirably begin to form, namely, at the topside of SiN-2 layer 315''' where SiO-3 layer 316 is to form, at the topside of HVOX layer 326'' where SiO layer 356 is to form, and at the topside of substrate 305, in area 330, where the LVOX layer 336 is to start forming. The radiation direction of the IR lamps 360 may play a role in preferential formation of radicals at topside surfaces. It is believed that some of the ISSG-produced radicals may continue to proceed along non-vertical paths 353 and 354 for possible formation of Bird's Beak oxide in the lateral direction between, for example, Poly-1 layer 312''' and SiO-1 layer 314. However, it is believed that such sidewall-approaching radicals (of non-vertical paths 353 and 354) are relatively few and short-lived in comparison to the radicals that form along the more, substantially vertical approach paths 355, 358a and 359 shown in FIG. 3. It is believed that as a result of the shorter lives of the laterally-approaching radicals 353-354, the Bird's Beak formation at the tower sidewalls is reduced in comparison to what would have formed (formation 257 of FIG. 2E) had HTO process 250' (FIG. 2E) been used instead. In one embodiment of the dry-ISSG process 350 (FIG. 3), a dry and low-pressure mixture of hydrogen gas ($H_2$) and oxygen gas ($O_2$) is streamed over a wafer while the wafer is rapidly heated (e.g., by RTP heating—rapid thermal process heating such as by way of IR radiation) to a high temperature of about 1000° C. The combination of supplied reactant gases and heat tends to generate both atomic oxygen (which could be in charged or neutral forms such as: $O^{--}$, $O^-$, $O^0$, $O^+$, $O^{++}$) and hydroxyl radicals (OH), more so—it is believed—at the exposed topside surfaces (315''') of the tower 310 that at the exposed sidewall surfaces of that tower. The atomic oxygen and/or hydroxyl radicals can diffuse into the exposed surface materials at various diffusion rates to produce correspondingly oxidized reaction products. An Applied Materials Centura™ Rapid-Thermal-Processing (RTP) reactor may be used for carrying out the dry-ISSG process. The Centura™ RTP tool (available from Applied Materials of Santa Clara, Calif.) can be modified to provide an ISSG operation with the volumetric flow ratio of $H_2/O_2$ being less than about 0.3 (that is, 30%), less than about 0.1 (10%), and even as low as about 0.02 (2%).

More specifically, in one embodiment according to the present disclosure, an ISSG recipe is used in an Applied Materials Centura™ Rapid-Processing (RTP) reactor as set forth in Table 1.

TABLE 1

| Step(s) | Step Details |
|---|---|
| 1, 2, 3 | Provide open-loop rapid thermal heating of in-chamber workpieces to an initial temperature of 482° C. at a pressure of 7.7 Torr and an O2 flow of 9.8 slm (standard liters per minute) |
| 4 | Provide a control-stabilizing ramp-up of temperature at 30° C./second from 482° C. to 500° C. with O2 flow at 9.8 slm |
| 5 | Provide a controlled ramp-up of temperature at 75° C./second from 500° C. to 850° C. with O2 flow at 9.8 slm |
| 6 | Provide a controlled slower ramp-up of temperature at 50° C./second from 850° C. to 900° C. with O2 flow at 9.8 slm |
| 7 | Provide a controlled & yet slower ramp-up of temperature at 25° C./second from 900° C. to 950° C. with O2 flow at 9.8 slm and H2 flow turned on at 0.2 slm |
| 8** | Maintain 950° C. for 200 seconds with O2 flow at 9.8 slm and H2 flow at 0.2 slm (so the volumetric flow ratio of $H_2/O_2$ is therefore approximately 0.0204.) |
| 9 | Provide a controlled ramp-down of temperature at 35° C./second from 950° C. to 690° C. with O2 and H2 flows turned off and N2 flow turned on at 5 slm |
| 10 | Further ramp down and/or processing |

Step 8 of Table 1 is where most of the dry-ISSG occurs to provide topside oxidation to a thickness of about 30-70 Å. The process can be varied as appropriate to provide ISSG-generated topside oxide in thickness range of about 20 Å to about 300 Å. The ISSG operating temperature may be set in, or varied over the range of about 850° C. to about 1050° C. The ISSG process maintenance time may be set in, or varied over the range of about 20 seconds to about 300 seconds. The $O_2$ flow rate may be set in, or varied over the range of about 3 slm to about 10 slm. The $H_2$ flow rate may be set in, or varied over the range of about 0.1 slm to about 1 slm. The $H_2/O_2$ volumetric flow ratio may be set in, or varied over the range of about 0.3 to about 0.01, and in one subset of embodiments, in, or over the range of about 0.1 to about 0.02. Pressure in the RTP chamber may be set in, or varied over the range of about 5 Torr to about 50 Torr.

Referring still to FIG. 3, the locations where the oxidizing agents of the ISSG process 350 may react is examined in more detail to clarify some points. Although the additional height 356 for the high-voltage-transistor dielectric is drawn at the top of HVOX block 326'', the actual mechanism by which that additional height 356 is attained is believed to be from the bottom up. The path 358a of travel and formation for the ISSG oxidizing agents continues vertically through the pre-formed HVOX block 326'' by diffusion to reach the underlying silicon in substrate 305. There, the ISSG oxidizing agents react with the silicon to form fresh silicon oxide which pushes the oxide above higher. For sake of illustrative convenience, the continued path is drawn at 358b, outside the HVOX block 326'' even though diffusion is through that block. Some of the oxidizing agents present within the continued path 358b may react with silicon oxide material in the HVOX block 326'' to thereby increase the degree of oxidation in the block 326'' and to thereby form a more perfected $SiO_2$ composition within the block 326''. As a result the insulative properties of the dielectric material of block 326'' is enhanced. The ability of the later-completed high voltage transistor (320'') to withstand relatively large voltages across its gate dielectric is enhanced. This is indirectly demonstrated in FIG. 4C by the improved dielectric characteristics of the low voltage transistor 330.

Although it is believed that atomic oxygen (352) is the primary oxidizing agent, it is possible that other byproducts (e.g., OH radicals 329) of the ISSG process may also act as oxidizing agents. It is believed that the atomic oxidizing agents 352/329 supplied at topside surfaces of tower 310 and transistor areas 320, 330 are highly reactive, particularly when energized by the radiation of the RTP lamps 360. As a result, they are able to initiate thermal growth of silicon oxide and/or silicon oxynitrides (SiOxNy) even at the nitride rich, topside surface of SiN layer 315'''. Oxidation rates on the order of as much as about 0.6 of silicon oxidation rates are believed possible at the nitride topside surface of SiN layer 315'''. Some of the ISSG produced, oxidizing agents, 353-354, may diffuse into exposed silicon oxide layers (e.g., 314) to thereby attack the topside of the Poly-1 layer 312''' and to thereby produce some amount of Bird's Beak formation. However, because of the short life span and/or high reactivity of such ISSG produced, oxidizing agents, 353-354, it is believed that they extinguish rapidly and do not penetrate as deeply into the silicon oxide layer (314) and/or to the same extent as can the longer-lived oxidizing agents (e.g., 253', 254' in FIG. 2E) of HTO processes. As a result, Bird's Beak formation is reduced (as will be demonstrated shortly by experimental results).

Figure 4A:
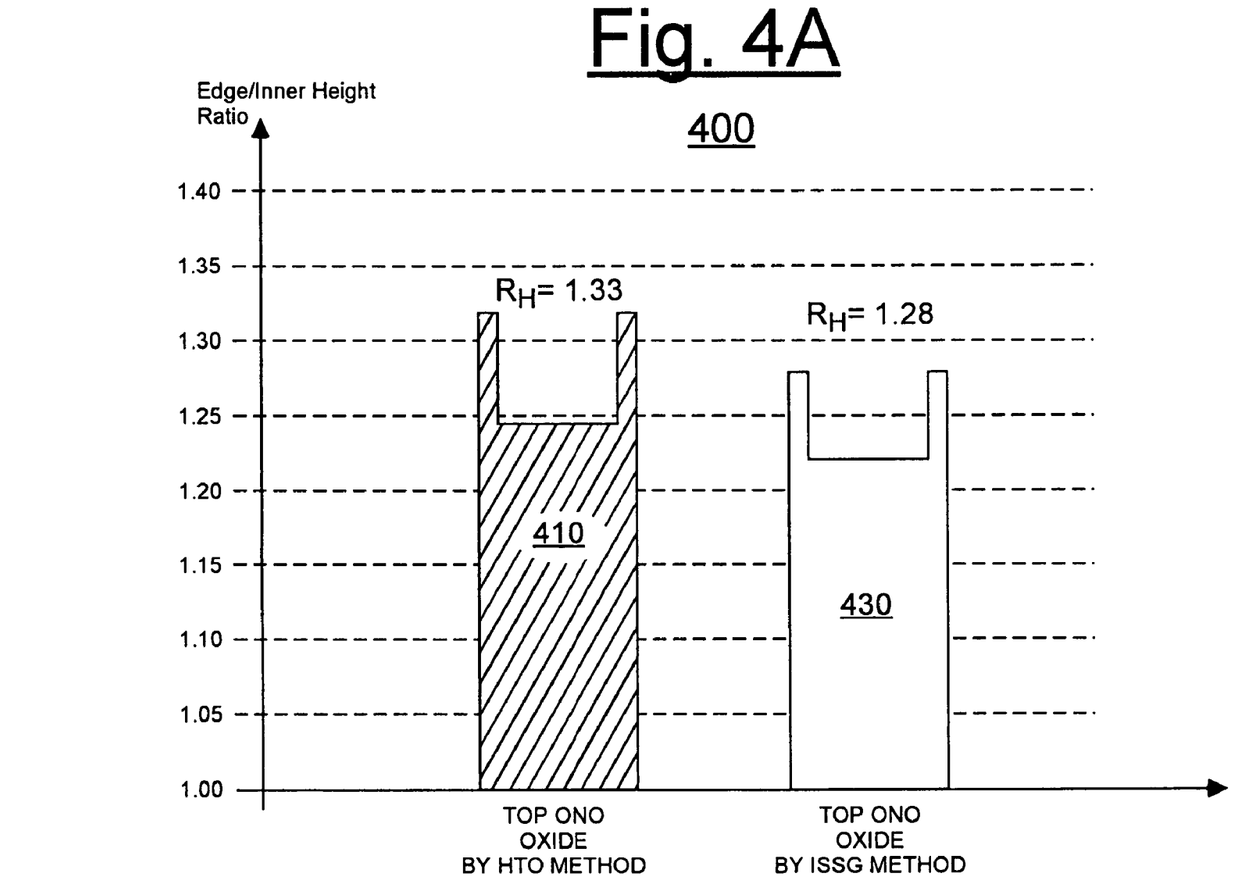
FIG. 4A is a first bar graph showing edge height to middle height ratios found for memory cells having HTO formed top-oxide and for memory cells having ISSG formed top-oxide.

FIG. 4A is a comparative graph 400 of experimental results. ONO towers were fabricated in substantially same ways except that the results of vertical bar 410 came from use of the HTO process (see 250 of FIG. 2D) for forming the upper silicon oxide layer 216 while the results of vertical bar 430 came from use of the dry-ISSG process (see 350/360 of FIG. 3) for forming the upper silicon oxide layer 316 of its respective ONO towers. After the towers were finished, measurements were taken of the resultant inner and outer stack heights, $H_{inner}$ and $H_{outer}$. Statistical regression was used to reduce experimental noise, and height variation ratios, $R_H = H_{outer}/H_{inner}$ were computed respectively for the statistically-corrected results of the HTO oxidation process and the ISSG-based oxidation process. As indicated in the bar graph 400, the computed RH value for the HTO-based devices was found to be about 1.33 and the computed RH value for the ISSG-based devices was found to be about 1.28. This may not seem like a big difference, but it can be. FIG. 4A uses iconic bar symbols 410 and 430 to visually demonstrate the difference. The ratio between the outer edge height of first iconic bar symbol 410 and its indented, inner height is about 1.33. The ratio between the outer edge height of second iconic bar symbol 430 and its indented, inner height is about 1.28. It can be visually appreciated from these that the represented amount of vertical height deformation is significantly different. When Bird's Beak formation occurs, as is shown in FIG. 2E, the outer height, $H_{outer}$ will be larger than the inner height, $H_{inner}$ by the amount indicated at 258. Such deformation, even if small, can create undesired stress and can change the effective capacitive plate area and/or the dielectric breakdown characteristics of the ONO stack 217e. FIG. 4A shows that there was less Bird's Beak formation in the ISSG-based ONO towers 430 than in HTO-based ONO towers 410 by virtue of RH being about 1.28 in the experiments of bar 430 and RH being about 1.33 in the experiments of bar 410.

Figure 4B:
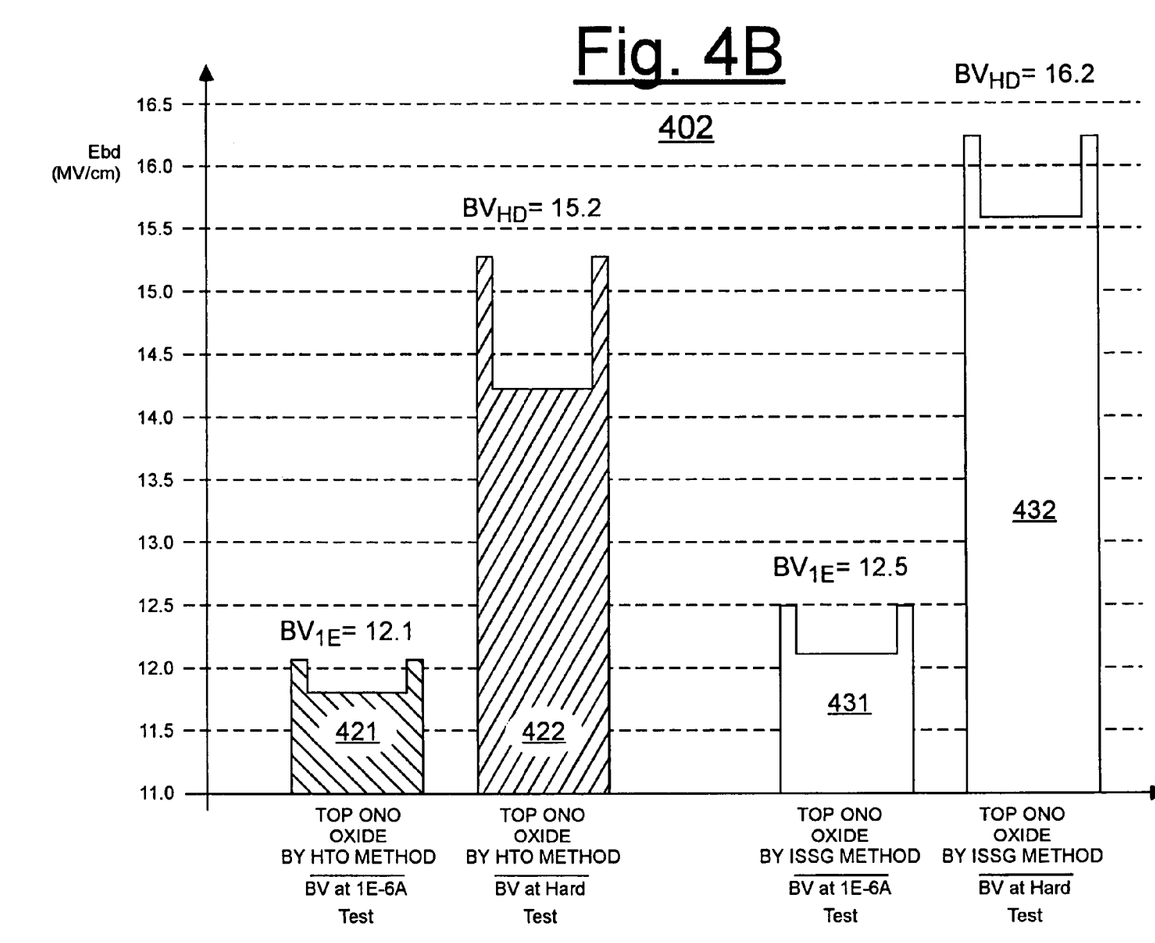
FIG. 4B is a second bar graph showing breakdown voltage results for memory cells having HTO formed top-oxide and for memory cells having ISSG formed top-oxide.

FIG. 4B is a second bar graph 402 showing breakdown voltage results for memory cells having HTO formed top-oxide and for memory cells having ISSG formed top-oxide. Breakdown is measured in terms of megavolts per centimeter of ONO thickness (MV/cm). Breakdown test were performed by plotting IV curves (current versus voltage) for capacitor structures having the ONO stack under-test as their dielectric. There are different measures for when breakdown is said to be occurring. In some situations, the reaching of a specific magnitude of $I_{LEAK}$ with increasing voltage, such as the one microampere (1E-06 A) level for a standard capacitor plate area (e.g., 1 mm$^2$), is deemed as a soft breakdown voltage ($VB_{soft}$). A rapid increase of $I_{LEAK}$ by one or more orders of magnitude for a small increase of stress voltage is often deemed as the hard breakdown voltage ($VB_{hard}$). $VB_{hard}$ is generally larger than $VB_{soft}$ and varies depending on quality and thickness of the stressed dielectric. It may be seen from FIG. 4B that test were carried out for soft breakdown voltage-per-cm of ONO thickness ($BV_{1E-6}$) and for hard breakdown voltage-per-cm of ONO thickness ($BV_{HD}$). In both instances, the ONO stacks having to top-oxide formed by the ISSG method (FIG. 3) exhibited comparatively higher breakdown voltages than comparative ONO stacks having to top-oxide formed by the HTO method (FIG. 2D). More specifically, bar 421 shows a soft breakdown field intensity ($BV_{1E-6}$) of about 12.1 megavolts/cm for the ONO stacks with top-oxide formed by the HTO method while bar 431 shows a greater soft breakdown field intensity ($BV_{1E-6}$) of about 12.5 megavolts/cm for the ONO stacks with top-oxide formed by the ISSG method. Bar 422 shows a hard breakdown field intensity ($BV_{HD}$) of about 15.2 megavolts/cm for the ONO stacks with top-oxide formed by the HTO method while bar 432 shows a greater hard breakdown field intensity ($BV_{HD}$) of about 16.2 megavolts/cm for the ONO stacks with top-oxide formed by the ISSG method.

Figure 4C:
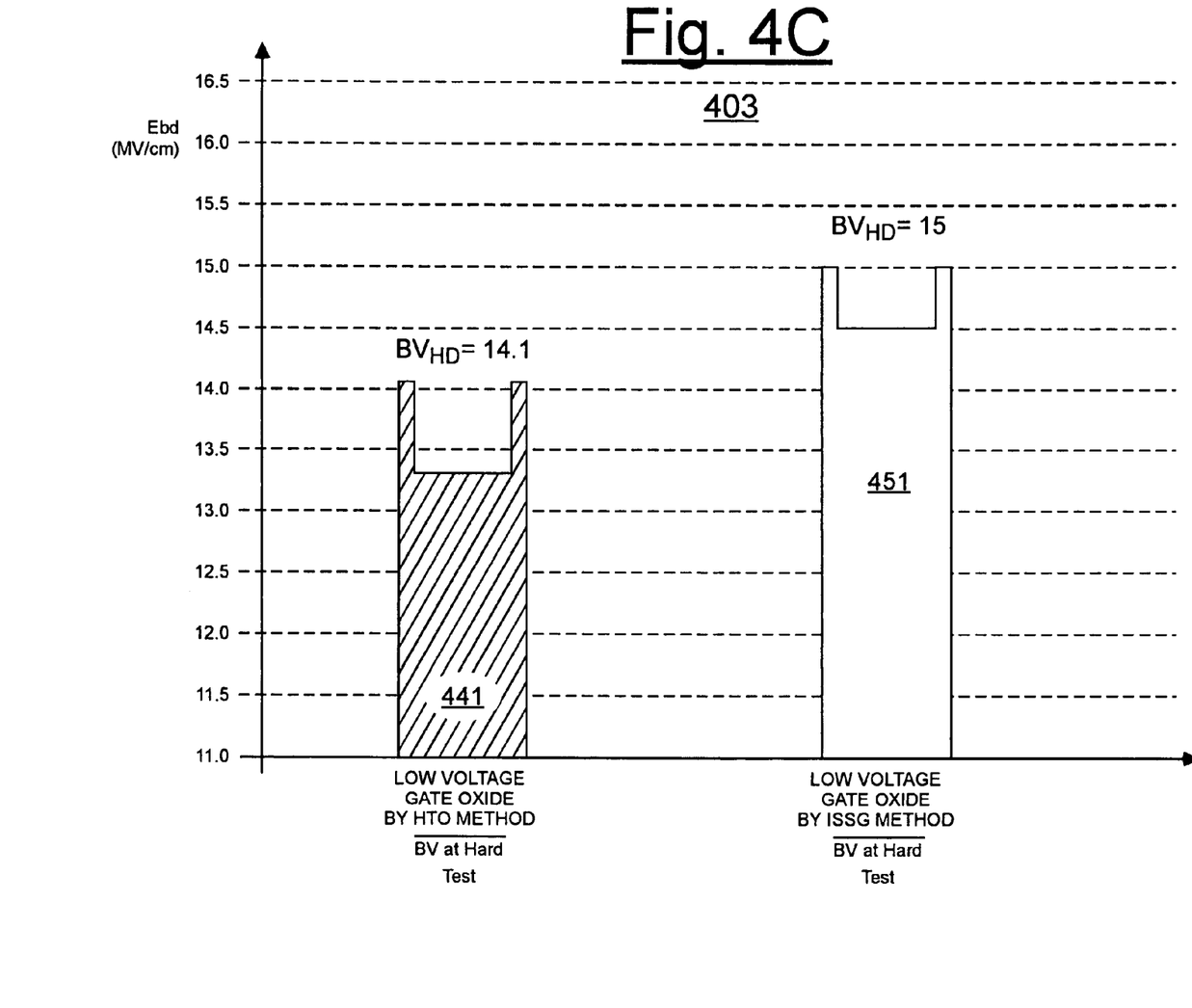
FIG. 4C is a third bar graph showing breakdown voltage results for adjacent low voltage transistors having HTO formed gate dielectric and for adjacent low voltage transistors having ISSG formed gate dielectric.

FIG. 4C is a third bar graph 403 showing breakdown voltage results for adjacent low voltage transistors having HTO formed gate dielectric and for adjacent low voltage transistors having ISSG formed gate dielectric. Breakdown was determined in terms of megavolts per centimeter of gate dielectric thickness (MV/cm). Bar 441 shows a hard breakdown field intensity ($BV_{HD}$) of about 14 megavolts/cm for the low voltage transistors having gate dielectric formed by the HTO method while bar 451 shows a greater hard breakdown field intensity ($BV_{HD}$) of about 15 megavolts/cm for the low voltage transistors having gate dielectric formed by the ISSG method. This demonstrates that the use of ISSG to react with silicon from the substrate and to produce silicon oxide produces a dielectric with better ability to withstand high voltages before breakdown as compared to use of HTO for forming the gate dielectrics of the low voltage transistors. The combination of FIGS. 4B and 4C demonstrates that the use of ISSG to react with silicon-nitride for forming top-oxide in the ONO stacks and to react with silicon for forming the gate dielectrics of adjacent low voltage transistors provides a combination of memory cells and low voltage transistors that are better able to withstand high voltages before breakdown as compared to use of HTO for forming counterpart combinations of memory cells and low voltage transistors. Because part of the gate dielectric in the high voltage transistors is also formed by ISSG when the ISSG process 350/360 of FIG. 3 is used, it may be expected that the gate dielectrics of high voltage transistors also exhibit a better ability to withstand high voltages before breakdown as compared to use of HTO for forming counterpart high voltage transistors.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of a first example of a further modification in accordance with the disclosure, after dry-ISSG is used to initiate formation of top-oxide for the ONO-type stacks and to simultaneously initiate formation of gate dielectric for the low voltage transistors and to simultaneously provide for further formation of gate dielectric for the high voltage transistors, another oxide forming process such as HTO may be used to complete formation of the ISSG-initiated formation.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but yet literally claimed subject matter by way of one or more further applications including those filed pursuant to 35 U.S.C. §120 and/or 35 U.S.C. §251.

What is claimed is:

1. A method of forming an oxide dielectric of an in-process ONO-type memory cell stack where an exposed top portion of the ONO-type memory cell stack includes a nitride, the method comprising:
   (a) subjecting the nitride-containing exposed top portion of the ONO-type memory cell stack to a dry ISSG process (In-Situ Steam Generation) where the dry ISSG process comprises:
      (a.1) flowing molecular oxygen ($O_2$) towards the stack; and
      (a.2) flowing molecular hydrogen ($H_2$) towards the stack, where the volumetric flow ratio of the $H_2$ to the $O_2$ is less than about 0.2; and
      (a.3) heating the exposed top portion of the ONO-type memory cell stack to a temperature of about 850° C. or higher so as to thereby encourage production from the flowing oxygen ($O_2$) and the flowing hydrogen ($H_2$) of one or more oxidizing radicals at the locality of the exposed top portion.

2. The dielectric forming method of claim 1 wherein:
   (a.2a) said volumetric flow ratio of $H_2/O_2$ is less than about 0.1.

3. The dielectric forming method of claim 1 wherein:
   (a.2a) said volumetric flow ratio of $H_2/O_2$ is equal to, or less than, about 0.02.

4. The dielectric forming method of claim 1 and further comprising:
   (b) continuing the subjecting of the exposed top portion of the ONO-type memory cell stack to the dry ISSG process for a duration selected from the range of about 20 seconds to about 300 seconds.

5. The dielectric forming method of claim 1 and further comprising:
   (a.1a) setting the $O_2$ flow rate over the range of about 3 slm to about 10 slm (ten standard liters per minute).

6. The dielectric forming method of claim 1 and further comprising:
   (a.2a) setting the $H_2$ flow rate over the range of about 0.1 slm to about 1 slm.

7. The dielectric forming method of claim 1 and further comprising:
   (b) establishing a chamber pressure for the flowing oxygen ($O_2$) and flowing hydrogen ($H_2$) in the range of about 5 Torr to about 50 Torr.

8. The dielectric forming method of claim 1 and further wherein:
   (b) the ONO-type memory cell stack has least one exposed sidewall that includes and exposed a plurality of exposed material layers and the sidewall-exposed material layers of the ONO-type memory cell stack include:
      (b.1) a first silicon nitride layer; and
      (b.2) a first silicon oxide layer.

9. The dielectric forming method of claim 8 and further wherein said plurality of sidewall-exposed material layers of the ONO-type memory cell stack include:
   (b.3) a silicon layer;
   (b.4) a tunnel dielectric layer;
   (b.5) wherein the first silicon nitride layer is above the first silicon oxide layer; and
   (b.6) wherein the combination of the first silicon oxide layer and the first silicon nitride layer is above the first silicon layer.

10. The dielectric forming method of claim 9 and further wherein:
    a height variation ratio, $R_H = H_{outer}/H_{inner}$, determined for the ONO-type memory cell stack after formation of the dielectric by the dry ISSG process, is about 1.28 or less, where $H_{inner}$ represents a stack height at a lateral position in the stack that is spaced away from the stack edges and where $H_{outer}$ represents a stack height at a lateral position near or at one of the stack edges.

11. The dielectric forming method of claim 1 and further comprising:
    (b) after said dry ISSG process, forming further and supplemental top oxide dielectric by a non-ISSG dielectric forming process.

12. A method of simultaneously forming gate oxide for one or more transistors of a common substrate and an oxide dielectric of an ONO-type memory cell stack of the common substrate where an exposed top portion of the ONO-type memory cell stack includes a nitride and an exposed sidewall of the stack includes and an oxide and a silicon layer, the method comprising:

(a) subjecting the common substrate, including an exposed top portion of the ONO-type memory cell stack and the exposed sidewall of the stack and including exposed areas where the one or more transistors are to be formed, to a dry ISSG process (In-Situ Steam Generation) where the dry ISSG process comprises:

(a.1) flowing molecular oxygen ($O_2$) towards the stack; and (a.2) flowing molecular hydrogen ($H_2$) towards the stack, where the volumetric flow ratio of the $H_2$ to the $O_2$ is less than about 0.2; and (a.3) heating the exposed top portion of the ONO-type memory cell stack to a temperature of about 850° C. or higher so as to thereby encourage production from the flowing oxygen ($O_2$) and the flowing hydrogen ($H_2$) of one or more oxidizing radicals at the locality of the exposed top portion.

13. The simultaneous dielectric forming method of claim 12 wherein:

said one or more transistors includes a relatively low voltage transistor and a comparatively higher voltage transistor, the low and high voltages referring to comparative drain to source voltages that will later develop respectively across the low and high voltage transistors.

14. The simultaneous dielectric forming method of claim 13 wherein:

the exposed area where the higher voltage transistor is to form has defined therein, a thermally grown dielectric prior to said subjecting of the exposed area of the higher voltage transistor to said dry ISSG process.

15. The dielectric forming method of claim 1 wherein:

(a.3a) said heating of the exposed top portion of the ONO-type memory cell stack includes ramping the top portion to a temperature of about 950° C. or higher.

16. The dielectric forming method of claim 1 wherein:

(a.3a) said heating of the exposed top portion of the ONO-type memory cell stack includes radiatively heating the top portion.

17. The dielectric forming method of claim 16 wherein said radiative heating includes using infrared-red lamps.

18. The dielectric forming method of claim 16 wherein said radiative heating includes directing radiated energy to the exposed top portion of the ONO-type memory cell stack.

19. The dielectric forming method of claim 1 wherein:

(a.3a) said heating of the exposed top portion of the ONO-type memory cell stack includes radiatively heating the top portion to a temperature of about 1000° C.

* * * * *